(12) United States Patent
Mehas et al.

(10) Patent No.: US 11,991,027 B2
(45) Date of Patent: May 21, 2024

(54) PHASE DEMODULATION USING PULSE SIGNAL

(71) Applicant: Renesas Electronics America Inc., Milpitas, CA (US)

(72) Inventors: Gustavo James Mehas, Mercer Island, WA (US); Giovanni Figliozzi, Zurich (CH); Xintian Shi, Zurich (CH); Francesco Santoro, Zurich (CH)

(73) Assignee: Renesas Electronics America Inc., Milpitas, CA (US)

( * ) Notice: Subject to any disclaimer, the term of this patent is extended or adjusted under 35 U.S.C. 154(b) by 170 days.

(21) Appl. No.: 17/678,175

(22) Filed: Feb. 23, 2022

(65) Prior Publication Data
US 2023/0269117 A1   Aug. 24, 2023

(51) Int. Cl.
| | |
|---|---|
| H03K 7/08 | (2006.01) |
| H02J 50/10 | (2016.01) |
| H03K 5/01 | (2006.01) |
| H03K 9/08 | (2006.01) |
| H04B 5/24 | (2024.01) |
| H04L 25/49 | (2006.01) |

(52) U.S. Cl.
CPC .......... H04L 25/4902 (2013.01); H02J 50/10 (2016.02); H03K 5/01 (2013.01); H04B 5/24 (2024.01)

(58) Field of Classification Search
CPC .... H04L 25/4902; H04B 5/0075; H03K 5/01; H02J 50/10; H02J 50/12
USPC .......... 375/238, 257, 258, 219, 220
See application file for complete search history.

(56) References Cited

U.S. PATENT DOCUMENTS

| | | | | |
|---|---|---|---|---|
| 8,417,359 | B2* | 4/2013 | Tsai | H02J 50/12 700/297 |
| 2012/0077537 | A1* | 3/2012 | Muratov | H02J 50/12 455/522 |
| 2016/0359467 | A1* | 12/2016 | Govindaraj | H01F 38/14 |
| 2017/0117751 | A1* | 4/2017 | Karnstedt | H03H 7/40 |
| 2018/0342889 | A1* | 11/2018 | Mynar | H02J 50/12 |
| 2020/0381947 | A1* | 12/2020 | Bhandarkar | H02M 3/1582 |
| 2023/0117400 | A1* | 4/2023 | Crnkovic | H02J 50/005 307/104 |
| 2023/0216342 | A1* | 7/2023 | Mehas | H02J 50/12 307/104 |
| 2023/0238831 | A1* | 7/2023 | Choi | H02M 7/5395 307/104 |

* cited by examiner

*Primary Examiner* — Phuong Phu
(74) *Attorney, Agent, or Firm* — SCULLY, SCOTT, MURPHY & PRESSER, P.C.

(57) ABSTRACT

Systems and methods for phase demodulation is described. A wireless power transmitter can include a controller, a transmission coil, and an integrated circuit connected to the controller and the transmission coil. The integrated circuit can be configured to measure a voltage of a transmission coil of a wireless power transmitter. The integrated circuit can be further configured to generate, based on the measured voltage, a pulse signal comprising a plurality of pulses. The integrated circuit can be further configured to send the pulse signal to the controller of the wireless power transmitter. The controller can be configured to perform phase demodulation using the pulse signal.

20 Claims, 10 Drawing Sheets

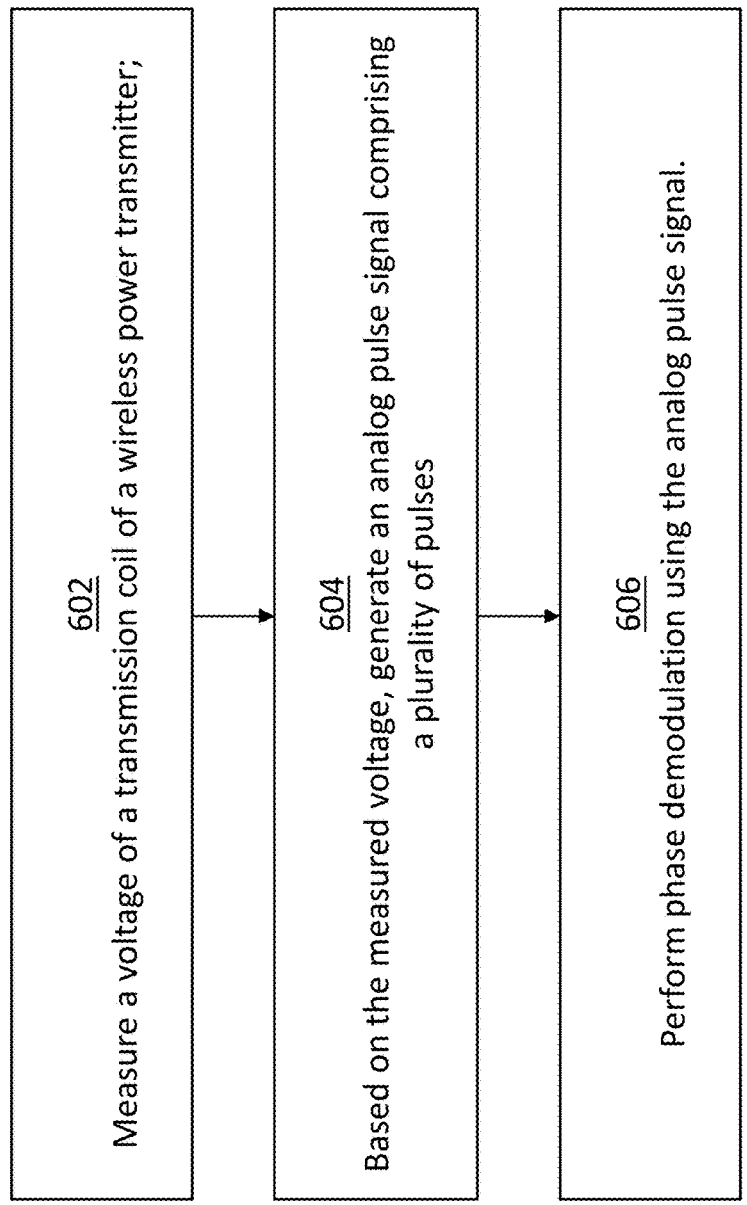

PHASE DEMODULATION USING PULSE SIGNAL

BACKGROUND OF THE SPECIFICATION

The present disclosure relates in general to apparatuses and methods for implementing phase demodulation in wireless power systems, particularly, generating an analog signal with a waveform resembling a pulse width modulation signal and using the analog signal to perform phase demodulation.

Wireless power system can include a transmitter having a transmission coil and a receiver having a receiver coil. In an aspect, the transmitter may be connected to a structure including a wireless charging region. In response to a device including the receiver being placed on the charging region, or in proximity to the charging region, the transmission coil and the receiver coil can be inductively coupled with one another to form a transformer that can facilitate inductive transfer of alternating current (AC) power. The transfer of AC power, from the transmitter to the receiver, can facilitate charging of a battery of the device including the receiver.

SUMMARY

In an embodiment, an apparatus is generally described. The apparatus can include a circuit connected configured to measure a voltage of a transmission coil of a wireless power transmitter. The circuit can be further configured to generate, based on the measured voltage, a pulse signal comprising a plurality of pulses. The circuit can be further configured to send the pulse signal to a controller of the wireless power transmitter.

In another embodiment, a wireless power transmitter is generally described. The wireless power transmitter can include a controller, a transmission coil, and an integrated circuit connected to the controller and the transmission coil. The integrated circuit can be configured to measure a voltage of a transmission coil of a wireless power transmitter. The integrated circuit can be further configured to generate, based on the measured voltage, a pulse signal comprising a plurality of pulses. The integrated circuit can be further configured to send the pulse signal to the controller of the wireless power transmitter. The controller can be configured to perform phase demodulation using the pulse signal.

In another embodiment, a method for performing phase demodulation is generally described. The method can include measuring, by a device, a voltage of a transmission coil of a wireless power transmitter. The method can further include based on the measured voltage, generating, by the device a pulse signal comprising a plurality of pulses. The method can further include performing, by the device, phase demodulation using the pulse signal.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

BRIEF DESCRIPTION OF THE DRAWINGS

FIG. 6 is a flowchart of an example process that may implement phase detection using pulse signal according to an embodiment of the disclosure.

DETAILED DESCRIPTION

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

In an aspect, wireless power transmitter and receiver can exchange different types of messages using various modulation schemes. These modulation schemes can include voltage modulation, current modulation, and phase modulation. Phase modulation can present challenges such as a need for transmitter controllers to include digital phase measurement circuitry, limited LC tank voltage monitoring window, limited input voltage range for analog-to-digital converters (ADC) in the controller, etc.

Figure 1:
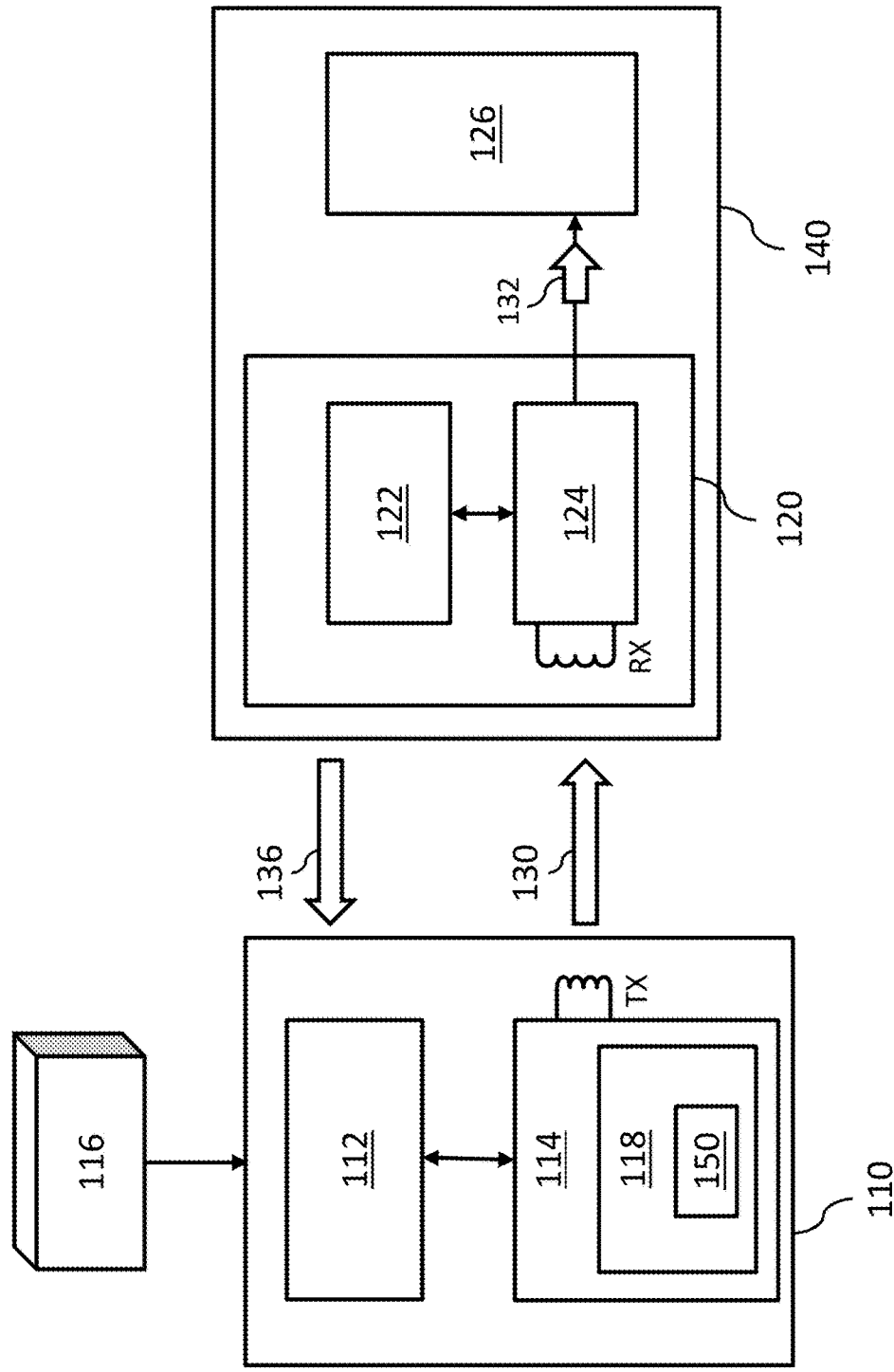
FIG. 1 is a block diagram of an example system for wireless power transfer according to an embodiment.

FIG. 1 is a diagram showing an example system 100 that implements wireless power transfer and communication according to an illustrative embodiment. System 100 can include a transmitter 110 and a receiver 120 that are configured to wirelessly transfer power and data therebetween via inductive coupling. While described herein as transmitter 110 and receiver 120, each of transmitter 110 and receiver 120 may be configured to both transmit and receive power or data therebetween via inductive coupling.

Transmitter 110 is configured to receive power from one or more power supplies and to transmit AC power 130 to receiver 120 wirelessly. For example, transmitter 110 may be configured for connection to a power supply 116 such as, e.g., an AC power supply or a DC power supply. Transmitter 110 can include a controller 112 and a power driver 114.

Controller 112 can be configured to control and operate power driver 114. Controller 112 can include, for example, a processor, central processing unit (CPU), field-programmable gate array (FPGA) or any other circuitry that is configured to control and operate power driver 114. While described as a CPU in illustrative embodiments, controller 112 is not limited to a CPU in these embodiments and may comprise any other circuitry that is configured to control and operate power driver 114. In an example embodiment, controller 112 can be configured to control power driver 114 to drive a coil TX of the power driver 114 to produce a magnetic field. Power driver 114 can be configured to drive coil TX at a range of frequencies and configurations defined by wireless power standards, such as, e.g., the Wireless Power Consortium (Qi) standard, the Power Matters Alliance (PMA) standard, the Alliance for Wireless Power (A for WP, or Rezence) standard or any other wireless power standards.

Receiver 120 can be configured to receive AC power 130 transmitted from transmitter 110 and to supply the power to one or more loads 126 or other components of a destination device 140. Load 126 may comprise, for example, a battery charger that is configured to charge a battery of the destination device 140, a DC-DC converter that is configured to supply power to a processor, a display, or other electronic components of the destination device 140, or any other load of the destination device 140. Destination device 140 may comprise, for example, a computing device, mobile device, mobile telephone, smart device, tablet, wearable device or any other electronic device that is configured to receive power wirelessly. In an illustrative embodiment, destination device 140 can include receiver 120. In other embodiments, receiver 120 may be separate from destination device 140 and connected to destination device 140 via a wire or other component that is configured to provide power to destination device 140.

Receiver 120 can include a controller 122 and a power rectifier 124. Controller 122 can include, for example, a processor, central processing unit (CPU), field-programmable gate array (FPGA) or any other circuitry that may be configured to control and operate power rectifier 124. Power rectifier 124 includes a coil RX and is configured to rectify power received via coil RX into a power type as needed for load 126. Power rectifier 124 is configured to rectify AC power received from coil RX into DC power 132 which may then be supplied to load 126.

As an example, when receiver 120 is placed in proximity to transmitter 110, the magnetic field produced by coil TX of power driver 114 induces a current in coil RX of power rectifier 124. The induced current causes AC power 130 to be inductively transmitted from power driver 114 to power rectifier 124. Power rectifier 124 receives AC power 130 and converts AC power 130 into DC power 132. DC power 132 is then provided by power rectifier 124 to load 126.

Transmitter 110 and receiver 120 are also configured to exchange information or data, e.g., messages, via the inductive coupling of power driver 114 and power rectifier 124. For example, before transmitter 110 begins transferring power to receiver 120, a power contract may be agreed upon and created between receiver 120 and transmitter 110. For example, receiver 120 may send communication packets 136 or other data to transmitter 110 that indicate power transfer information such as, e.g., an amount of power to be transferred to receiver 120, commands to increase, decrease, or maintain a power level of AC power 130, commands to stop a power transfer, or other power transfer information. In another example, in response to receiver 120 being brought in proximity to transmitter 110, e.g., close enough such that a transformer may be formed by coil TX and coil RX to facilitate power transfer, receiver 120 may be configured to initiate communication by sending a signal to transmitter 110 that requests a power transfer. In such a case, transmitter 110 may respond to the request by receiver 120 by establishing the power contract or beginning power transfer to receiver 120. For example, if the power contract is already in place. Transmitter 110 and receiver 120 may transmit and receive communication packets, data or other information via the inductive coupling of coil TX and coil RX.

In one embodiment, power driver 114 can include an analog front end (AFE) 118, where AFE 118 can be an integrated circuit (IC) that interface the coil TX to controller 112. AFE 118 can include a set of analog signal conditioning circuit components, such as analog amplifiers (e.g., operational amplifiers), filters, and application-specific integrated circuits, radio receivers, and other circuit components. Controller 112 can communicate with AFE 118 using one or more signals such as, e.g., pulse-width modulation (PWM) signals, control signal, or other signals, to control and operate power driver 114 to provide power to receiver 120 using coil TX, or to obtain various data or parameters from power driver 114 and/or receiver 120.

In one embodiment, AFE 118 can be configured to detect a current proportional to power being absorbed or consumed by transmitter 110, and convert the detected current into voltage. Controller 112 can use the voltage outputted from AFE 118 to perform functions such as foreign object detection, signal demodulation for message decoding, or to determine various control parameters that may control a performance of the transmitter. For example, communication packets 136 from receiver 120 can include signals that may be modulated under different modulation schemes, and AFE 118 can include circuitry configured to demodulate communication packets under the different modulation schemes.

In one embodiment, a circuit block 150 can be integrated in AFE 118 to generate a pulse signal that is an analog signal having a waveform resembling a PWM signal. Circuit block 150 can be an integrated circuit (IC). Controller 112 can perform phase demodulation on the pulse signal generated by circuit block 150. In an aspect, phase demodulation can refer to a phase difference, which can be measured as time units, between edges of two signals. Controller 112 can perform phase demodulation by determining pulse width of pulses among the pulse signal.

Figure 2A:
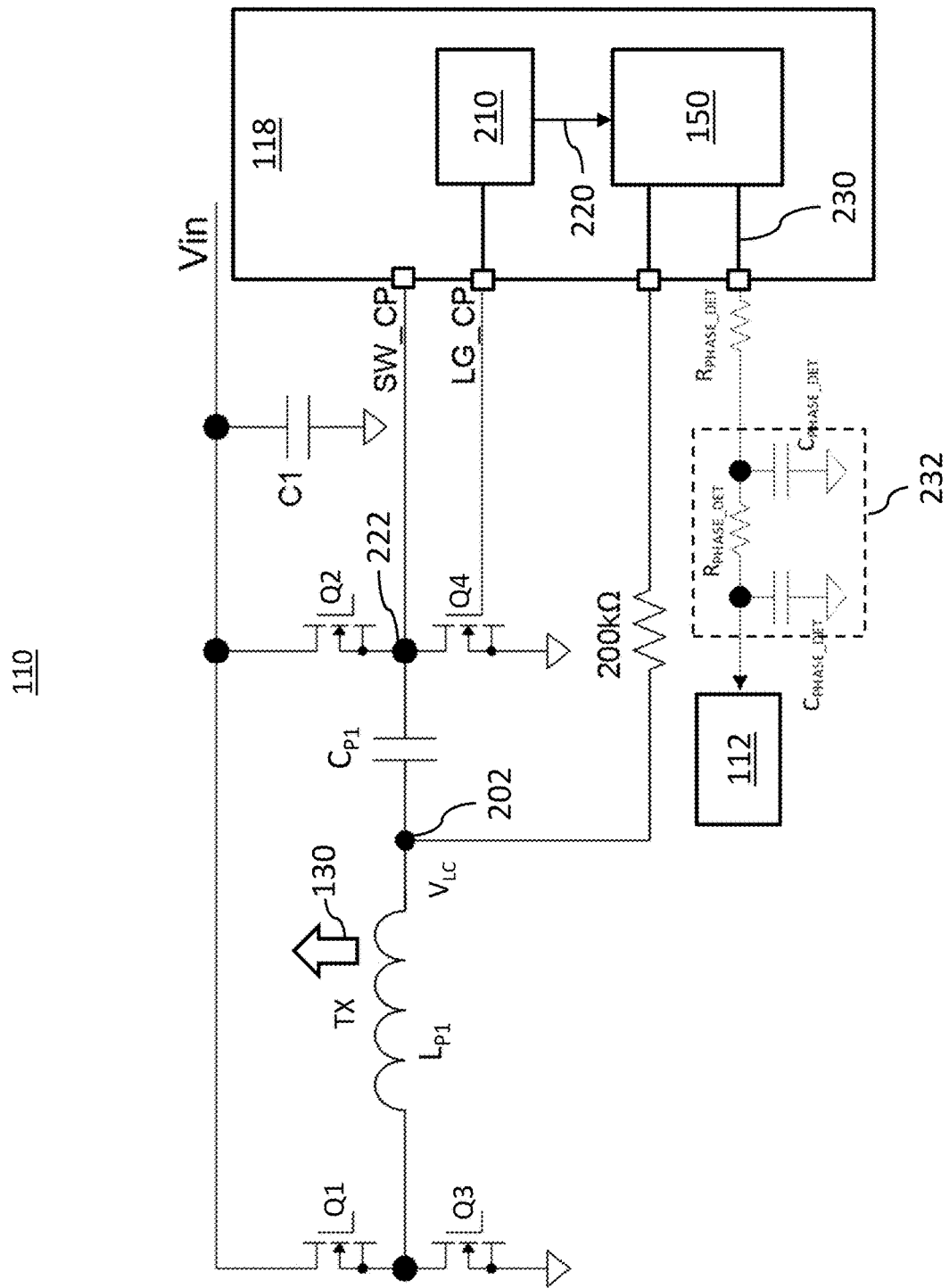
FIG. 2A is a circuit diagram illustrating details of an example transmitter of the system of FIG. 1 in one embodiment.

FIG. 2A is a circuit diagram illustrating an example transmitter of the system of FIG. 1 in one embodiment. Additional details of transmitter 110 is shown in FIG. 2A. In the example shown in FIG. 2A, a plurality of switching elements labeled as Q1, Q2, Q3, Q4 can be part of power driver 114. In one embodiment, switching elements Q1, Q2, Q3, Q4 can be metal-oxide-semiconductor field-effect transistors (MOSFET). Switching elements Q1, Q2 can be referred to as high-side switching elements, and switching elements Q3, Q4 can be referred to as low-side switching elements. Switching elements Q1, Q2, Q3, Q4 can form a H-bridge inverter in power driver 114.

Controller 112 can be configured to switch on one or more of switching elements Q1, Q2, Q3, Q4 by providing gate bias voltages to switching elements Q1, Q2, Q3, Q4. Controller 112 can be configured to switch off switching elements Q1, Q2, Q3, Q4 by not providing gate bias voltages. Switching elements Q1, Q4 can be switched on simultaneously while switching elements Q2, Q3 are switched off. Switching elements Q2, Q3 can be switched on simultaneously while switching elements Q1, Q4 are switched off. Power supply 116 can provide power having a voltage Vin to power driver 114. When switching elements Q1, Q4 are switched on, current (e.g., direct current) generated by Vin can flow to the coil TX via switching elements Q1, Q4. When switching elements Q2, Q3 are switched on, current generated by Vin can flow to the coil TX via switching elements Q2, Q3. The coil TX can output AC power 130 in response to receiving the current generated by Vin.

In an aspect, TX coil having inductance $L_{P1}$ and capacitor $C_{P1}$ forms a resonant circuit or an LC tank circuit. A LC tank voltage $V_{LC}$ of the LC tank can be measured by circuit block 150 and/or AFE 118 at a node 202. AFE 118 can include a PWM generator 210 configured to generate PWM signals. PWM generator 210 can generate PWM signals to drive the gates (or switch on and off) of switching elements Q1, Q2, Q3, Q4. In the example shown in FIG. 2A, PWM generator 210 can generate a PWM signal LG_CP to drive a gate of switching element Q4.

Circuit block 150 can be connected to PWM generator 210. Circuit block 150 can obtain a PWM signal 220 from PWM generator 210, and $V_{LC}$ from node 202. In one embodiment, PWM signal 220 can be LG_CP being used for driving Q4. Circuit block 150 can be configured to generate pulse signal 230 based on PWM signal 220 and $V_{LC}$. Pulse signal 230 can be an analog signal that has a waveform resembling a PWM signal. In one embodiment, PWM signal 220 obtained by circuit block 150 from PWM generator 210 can be generated by PWM generator 210 based on a desired or targeted pulse edge differences in pulse signal 230. In one or more embodiments, PWM signal 220 may not be used for driving Q4, and another PWM signal can be used for driving Q4 (e.g., PWM signal 220 and LG_CP may be different PWM signals). AFE 118 can monitor a switch node voltage SW_CP from a switch node 222 between Q2 and Q4, and can share the monitored voltage SW_CP with circuit block 150.

Figure 2B:
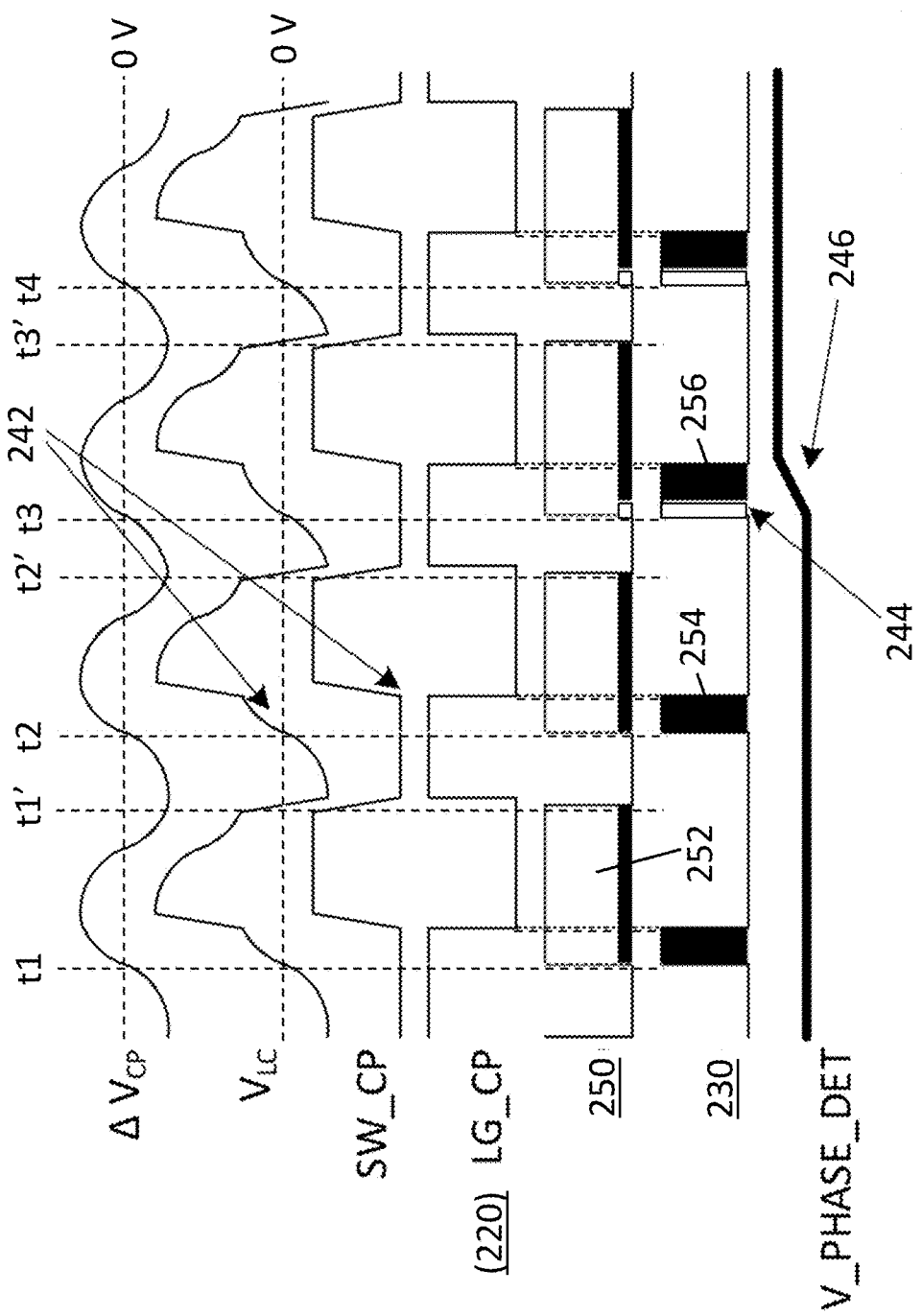
FIG. 2B is a diagram illustrating a plurality of signals corresponding to the circuit diagram of FIG. 2A in one embodiment.

In an aspect, in response to transmitter 110 receiving data, such as communication packets 136, from receiver 120, the varying impedance at receiver 120 can cause $V_{LC}$, and SW_CP, to change. The changes to $V_{LC}$ can reflect changes in an impedance of a load drawing power from transmitter 110 (e.g., the load being receiver 120). Waveforms of $V_{LC}$ and SW_CP are shown in FIG. 2B. Among the example waveforms shown in FIG. 2B, SW_CP can be in a logic low state in response to LG_CP being in a logic high state. Further, during logic low state of SW_CP, $V_{LC}$ can experience a zero crossing, where $V_{LC}$ crosses from a negative voltage region to a positive voltage region. For example, in FIG. 2B, a zero crossing event 242 can occur when SW_CP is in a logic low state at a time t2. Circuit block 150 can be configured to monitor $V_{LC}$ and SW_CP to identify zero crossing events of $V_{LC}$. In the example shown in FIG. 2B, $V_{LC}$ experiences zero crossing at times t1, t2, t3, and t4.

Based on the detection of $V_{LC}$ zero crossing events, circuit block 150 can generate a zero crossing signal 250 in FIG. 2B. Zero crossing signal 250 can be a PWM signal, where a pulse width of each pulse among zero crossing signal 250 is equivalent to a time in which a corresponding portion of $V_{LC}$ is greater than zero. For example, a first pulse 252 among zero crossing signal 250 begins at t1 and ends at t1', where $V_{LC}$ drops from positive voltage region to negative region at time t1'. In response to generating zero crossing signal 250, circuit block 150 can modulate PWM signal LG_CP using zero crossing signal 250 to generate pulse signal 230. In the example shown in FIG. 2B, the modulation of LG_CP can include a logical AND operation performed on LG_CP and zero crossing signal 250. Further, the modulation can terminate at a falling edge of LG_CP, such that each pulse in pulse signal 230 transitions to logic low at the falling edge of LG_CP. In one or more embodiments, modulation of LG_CP and zero crossing signal 250 can include other operations or conditions, such as setting pulse signal 230 to logic high state in response to LG_CP being in a logic low state and setting pulse signal 230 to logic low state in response to zero crossing signal 250 being in a logic low state.

In the example shown in FIG. 2B, a phase relationship or a time delay between LG_CP and $V_{LC}$ can change according to changes in the impedance of receiver 120. As shown in FIG. 2B, a time difference t2-t1' is greater than t3-t2', leading to a pulse 256 having a greater pulse width than a pulse 254 among pulse signal 230. Circuit block 150 can send pulse signal 230 to controller 112.

Controller 112 can perform phase demodulation by determining pulse width of pulses among pulse signal 230. Controller 112 can decode a first pulse width among pulse signal 230 as a binary zero, and a second pulse width among pulse signal 230 as binary one (or vice versa). Referring to the example shown in FIG. 2B, controller 112 can identify a pulse width difference 244 between pulse 254 and pulse 256 to determine that there are pulses of different pulse widths in pulse signal 230. Controller 112 can decode a pulse width of pulse 254 as a binary zero, and a pulse width of pulse 256 as a binary one (or vice versa). By using circuit block 150 to generate pulse signal 230 for controller 112, controller 112 may perform phase demodulation in a relatively simple manner when compared to other approaches. For example, controller 112 may not need to rely on additional hardware components configured to digitally count ticks to determine a duration in which $V_{LC}$ is in positive voltage region. In one embodiment, a filter 232 can be connected between AFE 118 and controller 112. Filter 232 can be applied on pulse signal 230 to convert pulse signal 230 into a measurable DC voltage. For example, as shown in FIG. 2B, a voltage labeled as V_PHASE_DET in FIG. 2B indicates a measurable DC voltage converted from pulse signal 230. When pulses among pulse signal 230 has the first pulse width representing binary zero, V_PHASE_DET is at a logic low state. When pulses among pulse signal 230 has the second pulse width representing binary one, V_PHASE_DET undergoes a transition 246 that transitions into logic high state or a higher analog voltage, and may also cross some threshold between logic low and high. An absolute value of the voltage represented by V_PHASE_DET can be read by controller 112 (via an ADC of controller 112), and the absolute value can be used for decoding ASK signals.

Figure 2C:
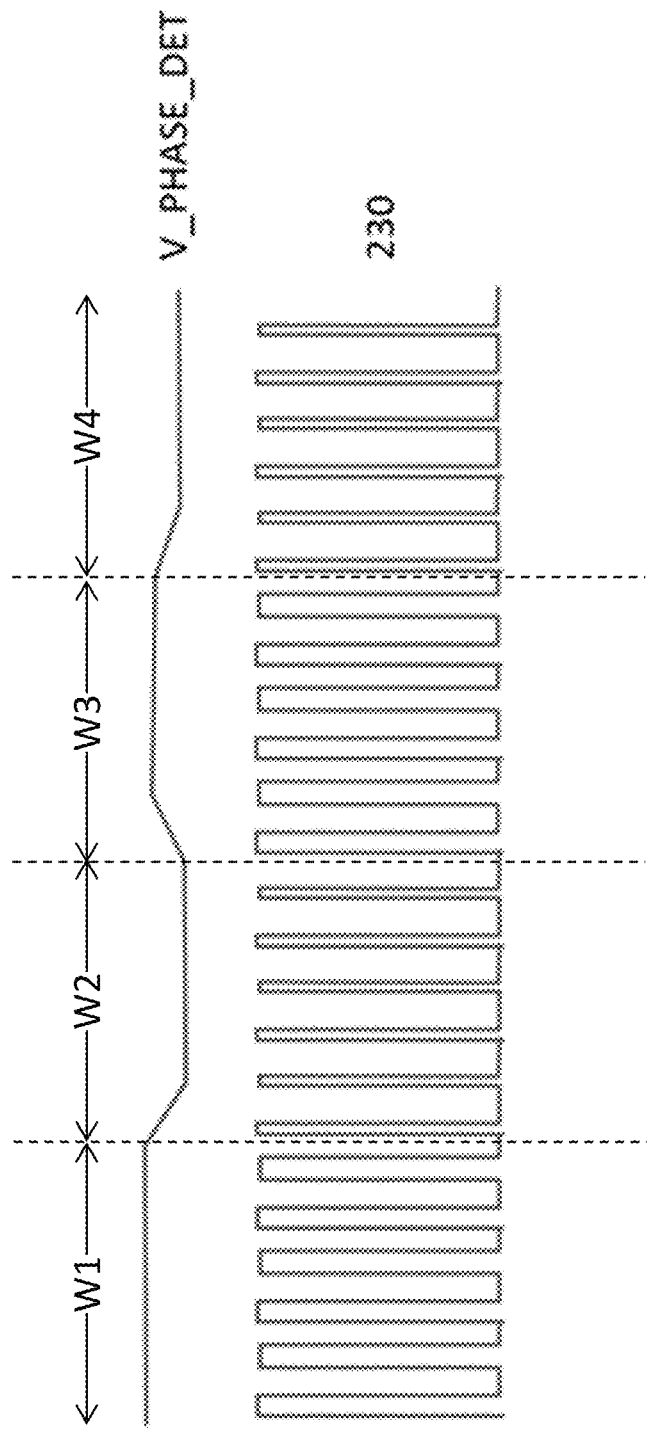
FIG. 2C is a diagram illustrating an example of a pulse signal corresponding to the circuit diagram of FIG. 2A in one embodiment.

Referring to FIG. 2C, in one embodiment, pulse signal 230 can resemble a Manchester code. Durations of sequences of pulses (or number of consecutive pulses) having same pulse width (e.g., sequences of pulses with the first pulse width, and sequences of pulses with the second pulse width) in the Manchester code can be used for decoding the communication data or messages in communication packet 136 (see FIG. 1). Also, a duration of a specific voltage level indicated by V_PHASE_DET can be used for demodulation to decode messages in communication packet 136. For example, a duration of the logic low state of V_PHASE_DET before transition 246 can represent a first value, and a duration of the logic high state of V_PHASE_DET after transition 246 can represent a second value. In the example shown in FIG. 2C, a plurality of values, data, symbols, or words W1, W2, W3, W4 can be represented by different sequences of pulses among pulse signal 230, or represented by duration of a specific voltage level of V_PHASE_DET. Therefore, by converting pulse 230 into measurable DC voltage V_PHASE_DET, controller 112 can measure the voltage levels of V_PHASE_DET to decode messages in communication packet 136.

Figure 3:
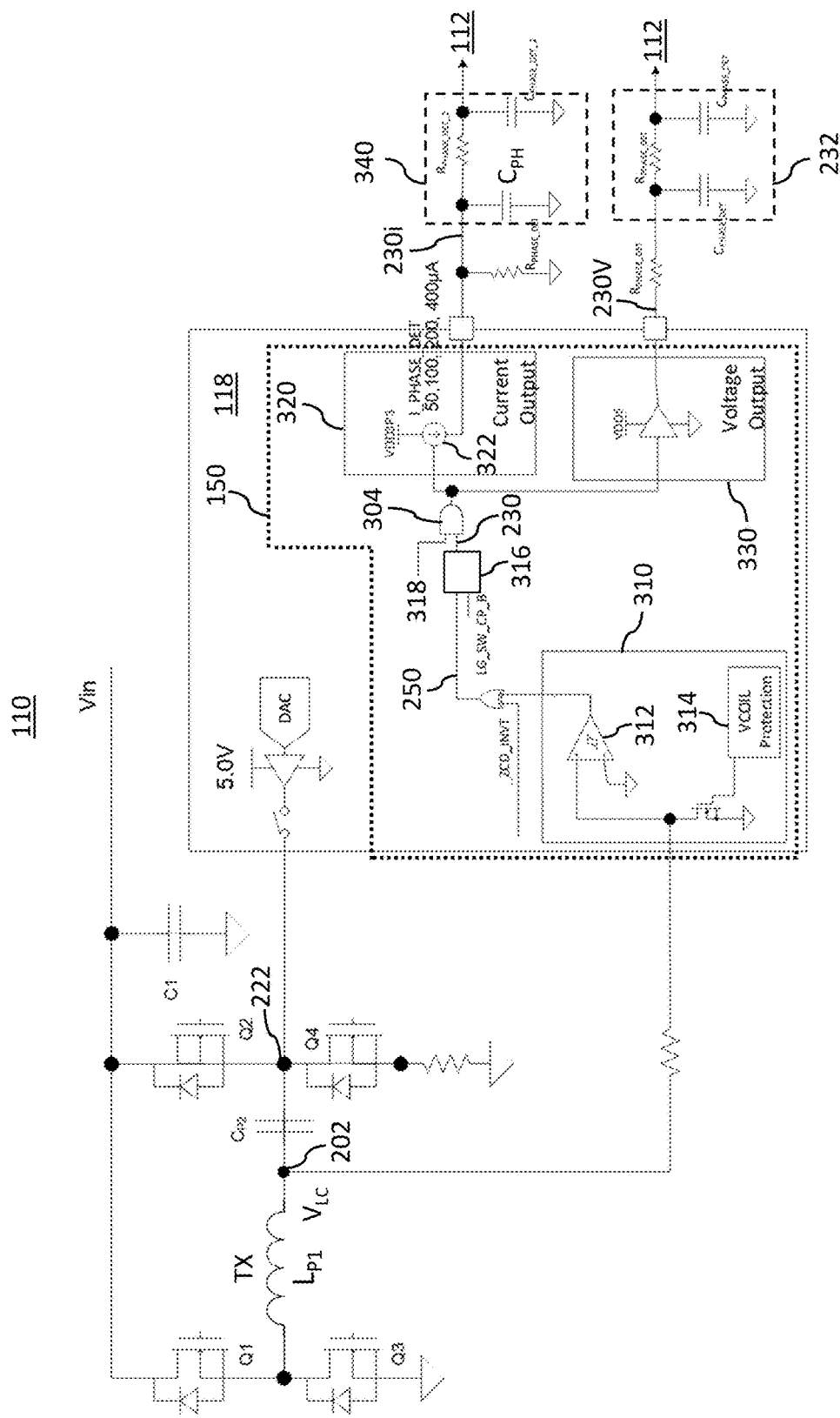
FIG. 3 is a circuit diagram illustrating details of an analog front end that can implement phase detection using pulse signal in one embodiment.

FIG. 3 is a circuit diagram illustrating details of an analog front end that can implement phase detection using pulse signal in one embodiment. The examples shown in FIG. 2A and FIG. 2B can be for embodiments where pulse signal 230 is generated as a voltage signal. The choice of generating pulse signal 230 as voltage signal or current signal can depend on a desired implementation of system 100. In an example shown in FIG. 3, circuit block 150 can include a plurality of components to accommodate different output types of pulse signal 230. For example, circuit block 150 can include a zero crossing detector 310 configured to detect zero crossing times of $V_{LC}$ (see FIG. 2A and FIG. 2B). Zero crossing detector 310 can include a comparator 312 and a overvoltage protection circuit 314. Overvoltage protection circuit 314 can be configured to detect an overvoltage condition based on measurements of $V_{LC}$.

Comparator 312 can be configured to detect zero crossing times of $V_{LC}$. In one embodiment, when $V_{LC}$ is in a negative voltage region, comparator 312 can output a zero or a voltage representative of zero voltage, and when $V_{LC}$ is in a positive voltage region, comparator 312 can output a non-zero voltage representative of nonzero voltage. In one embodiment, the output from comparator 312 can be zero crossing signal 250 shown in FIG. 2B. A circuit block 316 in circuit block 150 can receive zero crossing signal 250 from zero crossing detector 310, and PWM signal 220 (e.g., LG_CP) from PWM generator 210 (see FIG. 2A). Circuit block 316 can be an integrated circuit (IC) including latches, flip-flops, and/or other IC components. Circuit block 316 can be configured to combine zero crossing signal 250 and PWM signal 220, such as modulating PWM signal 220 using zero crossing signal 250, to generate pulse signal 230. In one embodiment, circuit block 316 can be implemented using a circuit that implements a function similar to a SR latch such that circuit block 316 can function as a noise filtering circuit to filter noise from zero crossing signal 250. In one embodiment, pulse signal 230 can be inputted into an AND gate 304 configured to perform logical AND on pulse signal 230 and a phase demodulation enable signal 318. Phase demodulation enable signal 318 can be used for enabling or disabling an output of pulse signal 230 to controller 112.

Circuit block 150 can further include a current output circuit 320 and a voltage output circuit 330. Pulse signal 230 can be inputted to one or more of current output circuit 320 and voltage output circuit 330. Voltage output circuit 330 can buffer pulse signal 230 out to controller 112, as a voltage signal 230V, via filter 232. The application of filter 232 can create a changing voltage waveform that can be decoded by controller 112 (e.g., by determining pulse width of pulses among pulse signal 230). Current output circuit 320 can be implemented for to drive a current source 322, and current from current source 322 can drive pulse signal 230 out to controller 112 as a current signal 230i. A resistor $R_{PHASE\_DET}$ can be connected to an output of current output circuit 320 to prevent immediate saturation of current signal 230i, and a voltage of current signal 230i can be filtered by a filter 340 before being received by controller 112.

Figure 4A:
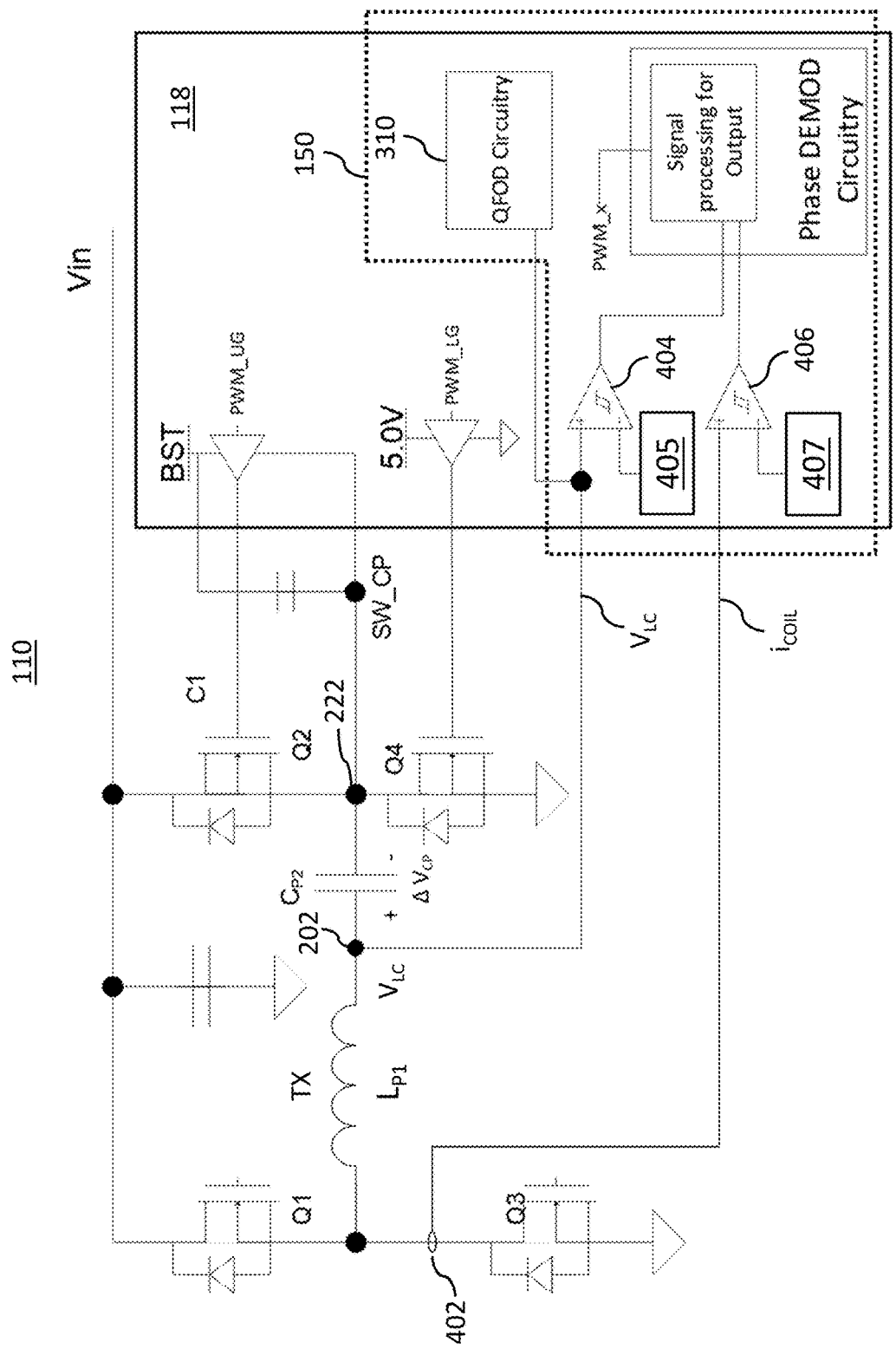
FIG. 4A is a circuit diagram illustrating details of an analog front end that can implement phase detection using pulse signal in one embodiment.

FIG. 4A is a circuit diagram illustrating details of an analog front end that can implement phase detection using pulse signal in one embodiment. In an example shown in FIG. 4A, a PWM signal PWM_UG can switch on or switch off switching element Q2, and another PWM signal PWM_LG can switch on or switch off switching element Q4 (e.g., PWM_LG can be LG_CP in FIG. 2B in one embodiment). Further, a current $i_{COIL}$, flowing through the coil TX can be sensed at a node 402 between the coil TX and switching element Q3. Circuit block 150 can be configured to use $i_{COIL}$, to perform the methods described herein. For example, circuit block 150 can be configured to detect zero crossings in $i_{COIL}$, to generate zero crossing signal 250.

In an aspect, due to system dynamics, a zero crossing time of $V_{LC}$ can occur during a dead time where switching elements Q2 and Q4 are off (e.g., both PWM_LG and PWM_UG are low). For example, referring to an example in FIG. 4B, SW_CP is low and LG_CP (or PWM_LG) is high in time intervals 410. However, in time intervals 410, $V_{LC}$ does not experience zero crossing from negative voltage region to positive voltage region. Instead, $V_{LC}$ experiences zero crossing from negative voltage region to positive voltage region at zero crossing times t_a, t_b, that are outside of time intervals 410. Since zero crossing times t_a and t_b are not times in which SW_CP is low (e.g., they are within a transition time where SW_CP transitions from low to high), circuit block 150 may not be able to detect the zero crossing times t_a and t_b.

Figure 4B:
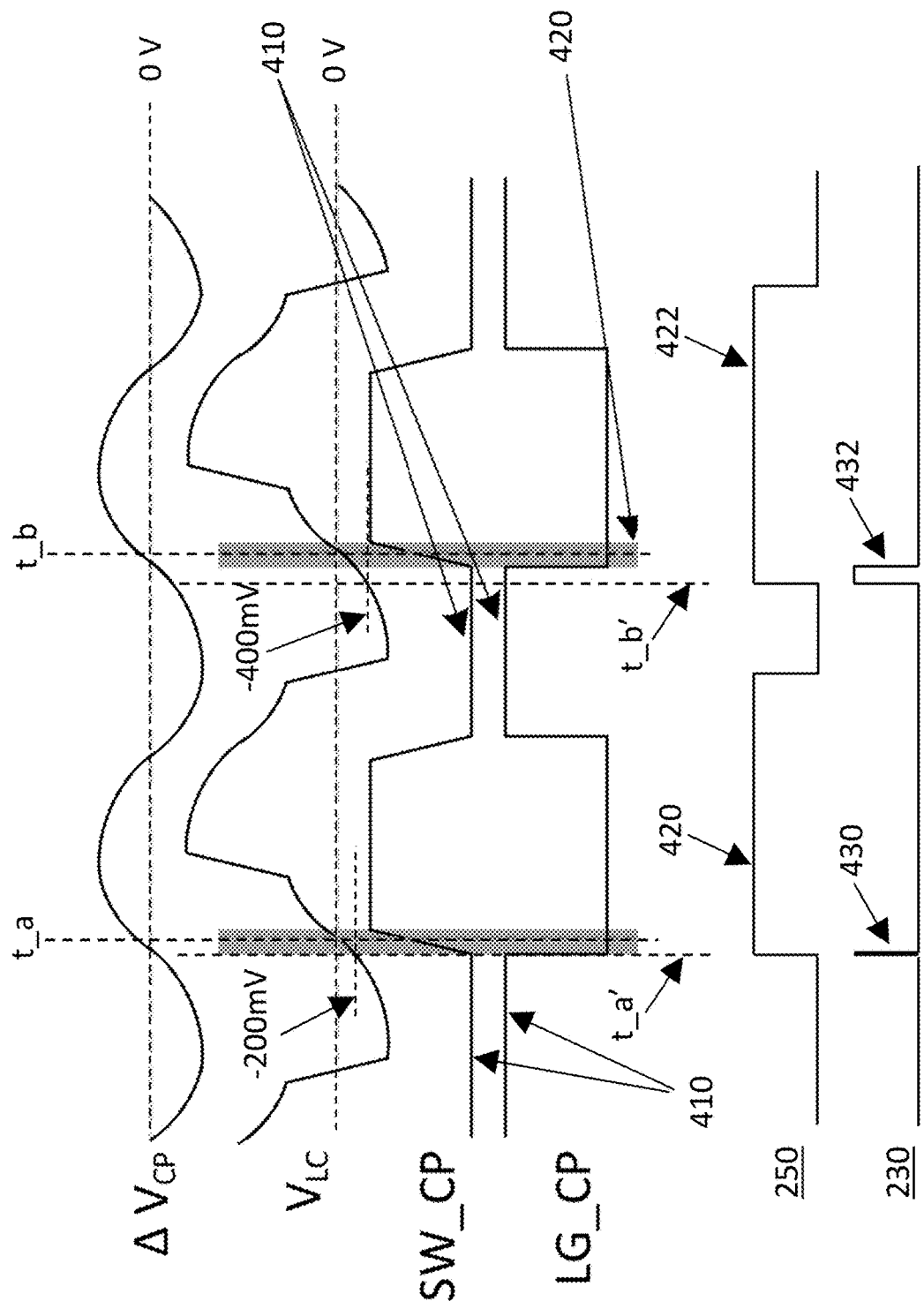
FIG. 4B is a diagram illustrating a plurality of signals corresponding to the circuit diagram of FIG. 4A in one embodiment.

In order to detect zero crossing times that may be within a transition time of SW_CP as shown in FIG. 4B, circuit block 150 can be further configured to adjust a zero crossing threshold voltage being used for generating pulse signal 230. In the example shown in FIG. 4A, circuit block 150 can include one or more circuit blocks 405, 407 configured to adjust the zero crossing threshold voltage for VLC and current $i_{COIL}$. In one embodiment, circuit block 405 can be configured to adjust zero crossing threshold voltage for $V_{LC}$, and circuit block 407 can be configured to adjust zero crossing threshold for current $i_{COIL}$. Circuit block 405 can also provide a reference voltage to a comparator 404 to facilitate adjustment of zero crossing threshold voltage for $V_{LC}$. Circuit block 407 can provide a reference voltage to a comparator 406 to facilitate adjustment of zero crossing threshold for $i_{COIL}$.

The zero crossing threshold voltage can be a voltage to trigger a start of a pulse in pulse signal 230 when SW_CP is low. In one embodiment, the adjustment to the zero crossing threshold voltage can be an increase or a decrease of the zero crossing threshold voltage. For example, an original zero crossing threshold voltage is zero volts (as shown in FIG. 2B). In a first example shown in FIG. 4B, circuit block 150 can adjust the zero crossing threshold to −200 millivolts (mV) such that a pulse 420 in zero crossing signal 250 can start at a time t_a', where time t_a' is earlier than t_a. In a second example shown in FIG. 4B, circuit block 150 can adjust the zero crossing threshold to −400 millivolts (mV) such that a pulse 422 in zero crossing signal 250 can start at a time t_b', where time t_b' is earlier than t_b. In one embodiment, circuit block 150 can adjust reference voltage 405 to adjust zero crossing threshold voltage of $V_{LC}$. For example, reference voltage 405 can be set to −200 mV, such that in response to $V_{LC}$ being less than −200 mV, the comparator in attenuator 404 can output a zero to indicate a detection of a zero crossing event. In the first example where the zero crossing threshold voltage is adjusted to −200 mV, a modulation of zero crossing signal 250 and LG_CP can result in a pulse 430 of pulse signal 230. In the second example where the zero crossing threshold voltage is adjusted to −400 mV, a modulation of zero crossing signal 250 and LG_CP can result in a pulse 432 of pulse signal 230. Based on the first and second examples in FIG. 4B, zero crossing threshold voltage −200 mV may not provide a pulse width that can be measurable or detectable by controller 112 (e.g., pulse width relatively narrow). Circuit block 150 can be configured to detect zero crossing times of $V_{LC}$ by monitoring whether $V_{LC}$ passes an initial zero crossing threshold voltage of zero volts, and whether $V_{LC}$ passes through other zero crossing threshold voltage.

The examples shown in FIG. 4B shows a reduction of the zero crossing threshold voltage. Circuit block 150 can also be configured to increase the zero crossing threshold voltage. In response to increasing the zero crossing threshold voltage, the rising edge of the pulses among zero crossing signal 250 may start later (e.g., t_a' can be later than t_a, and t_b' can be later than t_b).

In one embodiment, circuit block 150 can be configured to determine an amount of adjustment of the zero crossing threshold voltage. For example, in the example shown in FIG. 4B, in response to pulse 430 having a narrow pulse width that may be difficult to detect, circuit block 150 can further adjust the zero crossing threshold voltage to −400 mV. In another embodiment, circuit block 150 can be configured to determine the amount of adjustment of the zero crossing threshold voltage based on an amplitude and/or gain of $V_{LC}$.

Figure 4C:
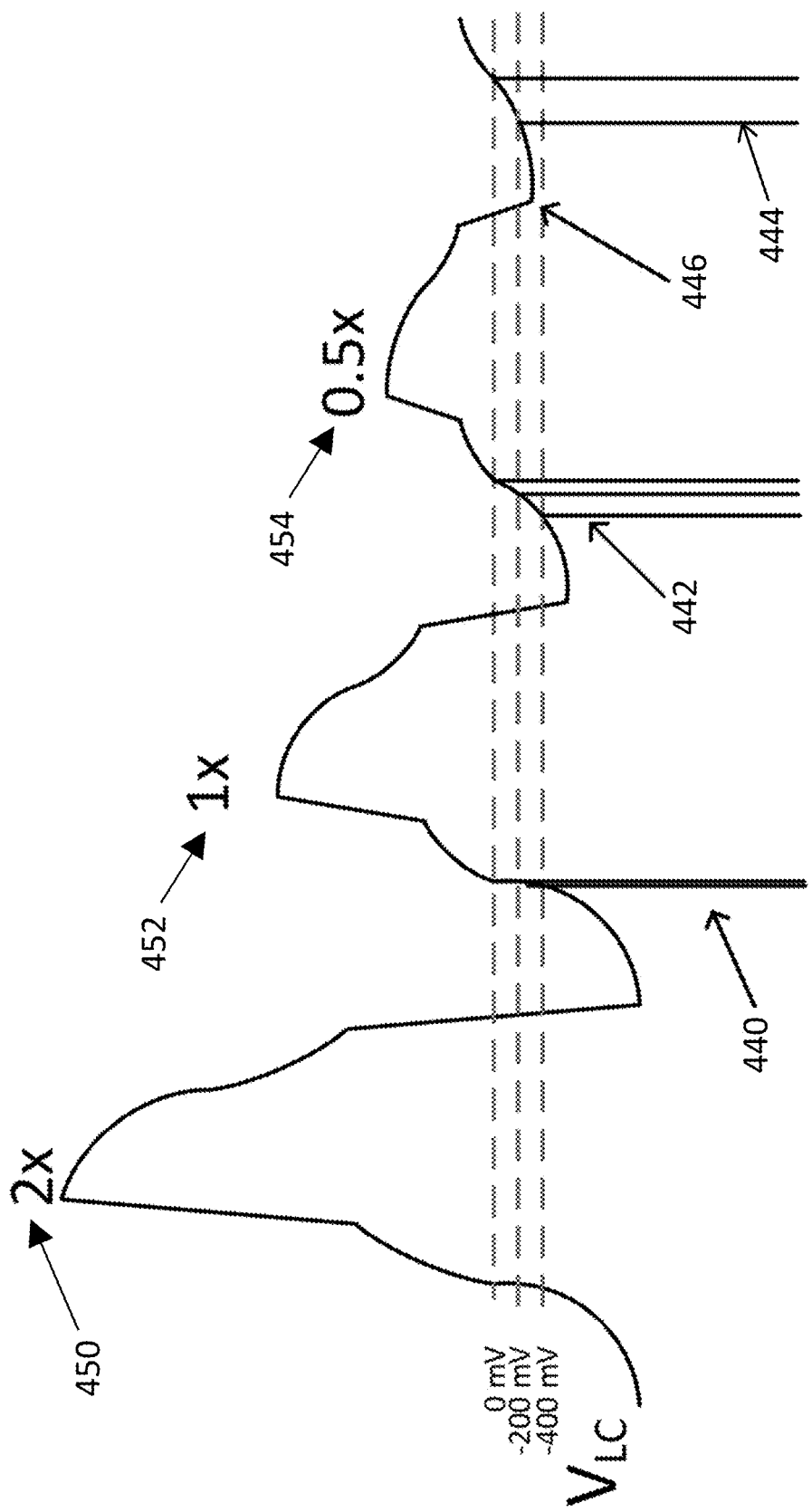
FIG. 4C is a diagram illustrating different adjustments to a zero crossing threshold voltage in one embodiment.

Referring to an example shown in FIG. 4C, a large gain 450 that is two times (2×) $V_{LC}$, the initial value 452 (e.g., 1× gain) of $V_{LC}$, and a small gain 454 (0.5×) of $V_{LC}$ are shown. A zero crossing change from 0 mV to −400 mV may provide lead to a change 440 in a rising edge time of a pulse in pulse signal 230. However, due to the large gain 450, change 440 may be insignificant and may cause pulse signal 230 to include pulses having a relatively narrow pulse width that may be undetectable. A zero crossing change from 0 mV to −400 mV may provide lead to a change 442 in a rising edge time of a pulse in pulse signal 230. However, change 442 may cause a zero crossing detection that is too close to a bottom peak of $V_{LC}$, where the region close to the bottom peak of $V_{LC}$ may have significant noise that can cause the zero crossing detection to be inaccurate. A zero crossing change from 0 mV to −400 mV may provide lead to a change 444 in a rising edge time of a pulse in pulse signal 230. However, due to the small gain 454, change 444 may be excessive such that a bottom peak 446 of $V_{LC}$ does not cross −400 mV, causing the zero crossing to undetectable. Circuit block 150 can be configured to run a process to test different adjustments to the zero crossing threshold voltage to identify an adjustment value that can lead to accurate zero crossing detection for generation of zero crossing signal 250, and generation of pulse signal 230 having pulses of optimal pulse width for controller 112 to perform phase demodulation.

In an aspect, $V_{LC}$ can be used for other applications such as foreign object detection. Circuit block 150 integrated in AFE 118 can use $V_{LC}$ to perform the phase detection and pulse signal generation described herein. The usage of $V_{LC}$ can avoid a need to add a signal pin on AFE 118. Further, the comparator 312 shown in FIG. 3 can be a ground-side comparator that can be implemented in a relatively simple manner when compared to a fully differential comparator floating on SW_CP, as a floating comparator can be more complex and can subject to delays and impedance mismatch errors.

Figure 5:
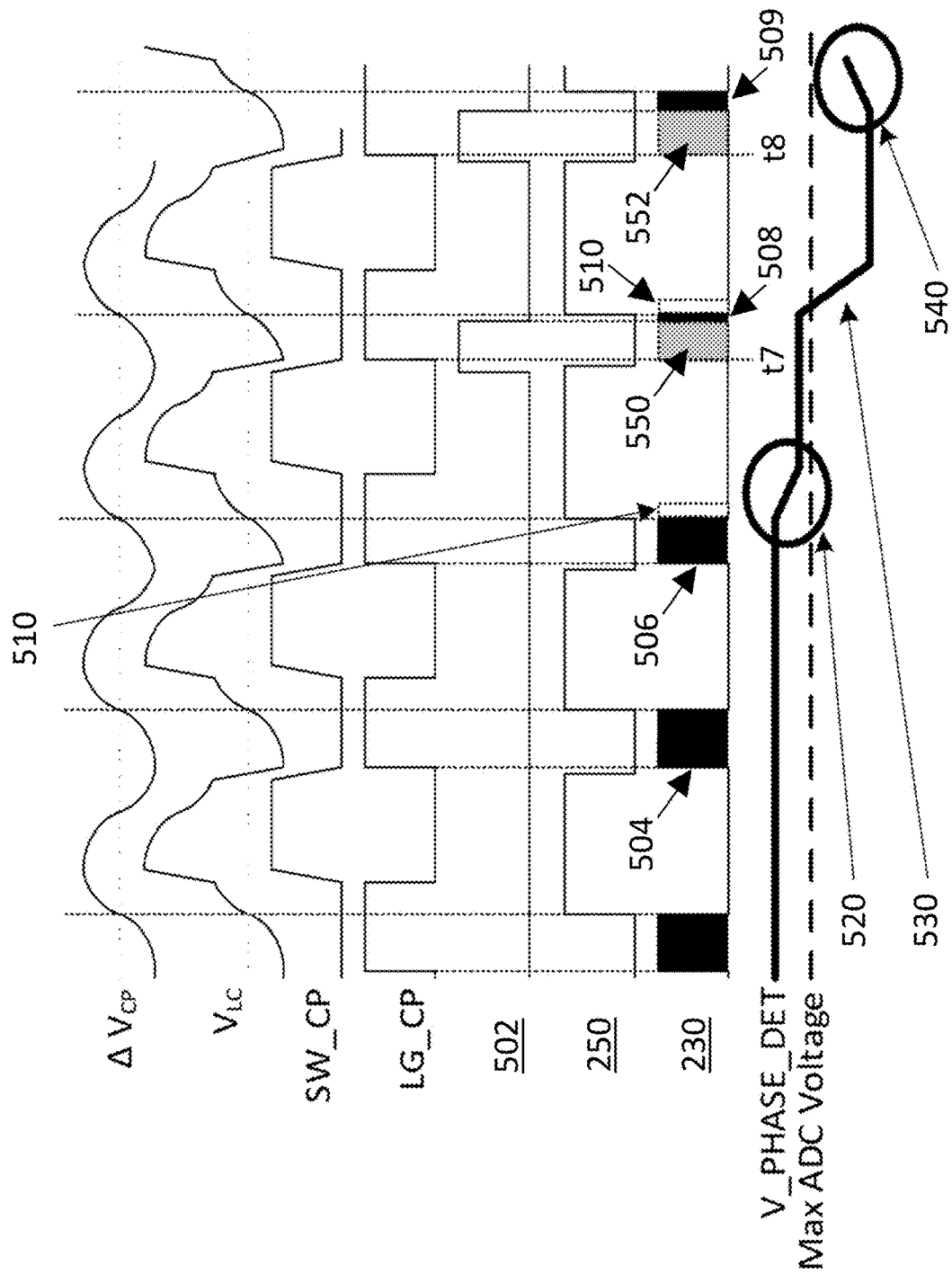
FIG. 5 is a diagram illustrating an addition of blanking offsets to pulses in a pulse signal in one embodiment.

FIG. 5 is a diagram illustrating an addition of blanking offsets to pulses in a pulse signal in one embodiment. In an example shown in FIG. 5, modulation of LG_CP and zero crossing signal 250 can include setting pulse signal 230 to logic high state in response to LG_CP being in a logic high state and zero crossing signal 250 being in a logic low state. In an aspect, a gain of pulse signal 230 can be increased to increase a signal-to-noise ratio (SNR), but the gain increased may need to be controlled to be within a maximum input voltage of an analog-to-digital converter (ADC) in controller 112 in order to perform demodulation successfully.

Circuit block 150 can be configured to control pulse width of the pulses among pulse signal 230 to control a voltage level being inputted into the ADC of controller 112. In an example, an increase in the pulse width of pulses among pulse signal 230 can increase the voltage level being inputted into the ADC of controller 112. In the example shown in FIG. 5, a voltage transition event 520 can occur in response to a phase change creating a pulse difference 510 between a pulse 504 and a pulse 506. However, in response to voltage transition event 520, a voltage level of pulse signal 230 (e.g., V_PHASE_DET) remains above a maximum ADC voltage of the ADC in controller 112. This failure to bring V_PHASE_DET below the maximum ADC voltage can cause the changes to the pulse width of pulse signal 230 to be undetected, and the undetected change leads to demodulation failure. In order to bring the voltage level of pulse signal 230 below the maximum ADC voltage, circuit block 150 can generate a blanking signal 502, and use the blanking signal 502 to adjust a voltage level of pulse signal 230 (or voltage level of V_PHASE_DET), such as removing or invalidating a portion of pulses among pulse signal 230 to decrease the voltage level of pulse signal 230.

In one embodiment, when blanking signal 502 is set to in a logic high state, pulse signal 230 can be zero. In the example shown in FIG. 5, pulse signal 230 can include a pulse 508 resulting from a removal of a portion 550 from an original pulse that started at t7. In other words, the original pulse starting at a time t7 was equivalent to a combination of portion 550 and pulse 508, but due to blanking signal 502 being set to a logic high state, portion 550 is removed. The removal of portion 550 results in a voltage transition event 530, where the voltage level of pulse signal 230 is brought to below the maximum voltage of the ADC in controller 112.

In response to the voltage level of pulse signal 230 falling below the maximum voltage level of the ADC, a next voltage transition event 540 created by a next pulse 509 having an increased pulse width, can maintain the voltage level of pulse signal 230 below the maximum voltage of the ADC. An original pulse starting at a time t8 was equivalent to a combination of a portion 552 and pulse 509, but due to blanking signal being set to in a logic high state, portion 552 is removed. At transition event 540, V_PHASE_DET remains under the maximum ADC voltage, and transition event 540 can be detectable such that data or messages can be decoded from V_PHASE_DET.

In one embodiment, controller 112 can monitor the voltage level of pulse signal 230 in order to maintain the voltage level of pulse signal 230 under the maximum voltage of the ADC. For example, at voltage transition event 540, if V_PHASE_DET exceed the maximum voltage of the ADC once again, controller 112 can send a command to AFE 118 or circuit block 150 to increase a pulse width of the pulses in blanking signal 502. The increased pulse width of pulses in blanking signal 502 can lead to removal of additional portions of pulses among pulse signal 230, leading to a decrease in the voltage level of pulse signal 230.

In brief, the methods and systems described herein can allow AFE 118 to pre-process the LC tank voltage $V_{LC}$ before controller 112 performs phase demodulation. Pulse signal 230 generated by AFE 118 can allow controller 112 to preform phase demodulation with a relatively simple approach, such as decoding pulse widths instead of relying on complex digital circuitry to count ticks in $V_{LC}$. Further, circuit block 150 integrated in AFE 118 can use $V_{LC}$, which is an existing signal being used by AFE 118 for other applications. The usage of $V_{LC}$ avoids a need to add a new pin to AFE 118. Furthermore, circuit block 150 can detect zero crossings of $V_{LC}$ that may be within previously undetectable regions (e.g., transition time of SW_CP signal). Still further, circuit block 150 can adjust a voltage level of pulse signal 230 to increase SNR and to accommodate a limit of maximum voltage allowed in an ADC of controller 112.

FIG. 6 is a flowchart of an example process that may implement phase detection using pulse signal according to an embodiment of the disclosure. The process 600 can include one or more operations, actions, or functions as illustrated by one or more of blocks 602, 604, and/or 606. Although illustrated as discrete blocks, various blocks can be divided into additional blocks, combined into fewer blocks, eliminated, performed in different order, or performed in parallel, depending on the desired implementation.

Process 600 can begin at block 602. At block 602, a device, such as a wireless power transmitter, can measure a voltage of a transmission coil of the wireless power transmitter. Process 600 can proceed from block 602 to block 604. At block 604, the device can, based on the measured voltage, generate a pulse signal comprising a plurality of pulses. Process 600 can proceed from block 604 to block 606. At block 606, the device can perform phase demodulation using the pulse signal.

In one embodiment, the device can determine a zero crossing time of the measured voltage. The device can obtain a first pulse width modulation (PWM) signal that varies inversely with a switch node voltage of the wireless power transmitter. The device can generate a second PWM signal based on the zero crossing time and the switch node voltage. The device can modulate the first PWM signal using the second PWM signal to generate the pulse signal. In one embodiment, the device can adjust a zero crossing threshold being used for the determination of the zero crossing time.

In one embodiment, the device can generate a blanking signal and generate the pulse signal based on the blanking signal to adjust (e.g., reduce) a voltage level of the pulse signal. In one embodiment, a pulse width of each pulse among the plurality of pulses can be based on an amount of time in which the measured voltage is greater than zero. In one embodiment, the pulse signal can be one of a voltage signal and a current signal. In one embodiment, the device can perform the phase demodulation by determining a pulse width of each pulse among the plurality of pulses in the pulse signal.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
a circuit configured to:
measure a voltage of a transmission coil of a wireless power transmitter;
determine a zero crossing time of the measured voltage;
generate, based on the zero crossing time of the measured voltage and a switch node voltage of the wireless power transmitter, a pulse signal comprising a plurality of pulses; and
send the pulse signal to a controller of the wireless power transmitter.

2. The apparatus of claim 1, wherein the circuit is configured to:
obtain a first pulse width modulation (PWM) signal that varies inversely with the switch node voltage of the wireless power transmitter;
generate a second PWM signal based on the zero crossing time and the switch node voltage; and
modulate the first PWM signal using the second PWM signal to generate the pulse signal.

3. The apparatus of claim 2, wherein the first PWM signal is being used for driving one of a low-side side switching element and a high-side switching element of the wireless power transmitter.

4. The apparatus of claim 2, wherein the circuit is configured to adjust a zero crossing threshold being used for the determination of the zero crossing time.

5. The apparatus of claim 1, wherein a pulse width of each pulse among the plurality of pulses is based on an amount of time in which the measured voltage is greater than zero.

6. The apparatus of claim 1, wherein the pulse signal is one of a voltage signal and a current signal.

7. The apparatus of claim 1, wherein the circuit is configured to:
generate a blanking signal; and
generate the pulse signal based on the blanking signal to adjust a voltage level of the pulse signal.

8. A wireless power transmitter comprising:
a controller; and
an integrated circuit connected to the controller and a transmission coil of the wireless power transmitter, the integrated circuit being configured to:
measure a voltage of the transmission coil of the wireless power transmitter;
determine a zero crossing time of the measured voltage;
generate, based on the zero crossing time of the measured voltage and a switch node voltage of the wireless power transmitter, a pulse signal comprising a plurality of pulses; and
send the pulse signal to the controller of the wireless power transmitter,
wherein the controller is configured to perform phase demodulation using the pulse signal.

9. The wireless power transmitter of claim 8, wherein the integrated circuit is configured to:
obtain a first pulse width modulation (PWM) signal that varies inversely with the switch node voltage of the wireless power transmitter;

generate a second PWM signal based on the zero crossing time and the switch node voltage; and modulate the first PWM signal using the second PWM signal to generate the pulse signal.

10. The wireless power transmitter of claim 9, wherein the first PWM signal is being used for driving a low-side side switching element of the wireless power transmitter.

11. The wireless power transmitter of claim 9, wherein the integrated circuit is configured to adjust a zero crossing threshold being used for the determination of the zero crossing time.

12. The wireless power transmitter of claim 8, wherein a pulse width of each pulse among the plurality of pulses is based on an amount of time in which the measured voltage is greater than zero.

13. The wireless power transmitter of claim 8, wherein the pulse signal is one of a voltage signal and a current signal.

14. The wireless power transmitter of claim 8, wherein the integrated circuit is configured to:

generate a blanking signal; and generate the pulse signal based on the blanking signal to adjust a voltage level of the pulse signal to below a maximum input voltage level of an analog-to-digital converter (ADC) of the controller.

15. The wireless power transmitter of claim 8, wherein the controller is configured to determine a pulse width of each pulse in the pulse signal to perform the phase demodulation.

16. A method for performing phase demodulation, the method comprising:

measuring, by a device, a voltage of a transmission coil of a wireless power transmitter;

determining, by the device, a zero crossing time of the measured voltage;

based on the zero crossing time of the measured voltage and a switch node voltage of the wireless power transmitter, generating, by the device, a pulse signal comprising a plurality of pulses; and performing, by the device, phase demodulation using the pulse signal.

17. The method of claim 16, further comprising:

obtaining, by the device, a first pulse width modulation (PWM) signal that varies inversely with the switch node voltage of the wireless power transmitter;

generating, by the device, a second PWM signal based on the zero crossing time and the switch node voltage; and modulating, by the device, the first PWM signal using the second PWM signal to generate the pulse signal.

18. The method of claim 17, further comprising adjusting, by the device, a zero crossing threshold being used for the determination of the zero crossing time.

19. The method of claim 16, further comprising:

generating, by the device, a blanking signal; and generating, by the device, the pulse signal based on the blanking signal to adjust a voltage level of the pulse signal.

20. The method of claim 16, wherein performing the phase demodulation comprises determining, by the device, a pulse width of each pulse among the plurality of pulses in the pulse signal.

* * * * *